United States Patent
Raymond

(12) 
(10) Patent No.: US 6,541,301 B1
(45) Date of Patent: Apr. 1, 2003

(54) LOW RF LOSS DIRECT DIE ATTACH PROCESS AND APPARATUS

(76) Inventor: Brook David Raymond, 2415 Arenham Ave., Roanoke, VA (US) 24014

( * ) Notice: Subject to any disclaimer, the term of this patent is extended or adjusted under 35 U.S.C. 154(b) by 0 days.

(21) Appl. No.: 09/249,352

(22) Filed: Feb. 12, 1999

(51) Int. Cl.[7] .......................... H01L 21/44; H01L 21/48
(52) U.S. Cl. .................. 438/106; 438/112; 438/113; 438/612
(58) Field of Search ................................. 438/106, 112, 438/113, 612, 780–784; 427/79, 97, 404

(56) References Cited

U.S. PATENT DOCUMENTS

| | | | |
|---|---|---|---|
| 4,631,812 A | 12/1986 | Young | 29/714 |
| 4,694,570 A | 9/1987 | Rudolph et al. | 29/740 |
| 5,044,069 A | 9/1991 | Asai et al. | 29/740 |
| 5,455,064 A | * 10/1995 | Chou et al. | 427/71 |
| 5,692,292 A | 12/1997 | Asai et al. | 29/740 |
| 6,107,119 A | * 8/2000 | Farnworth et al. | 438/106 |

OTHER PUBLICATIONS

Fuji America Corporation; CP–642 High Speed Chip Placer; 1998; pp. 1–3.

Fuji America Corporation; CP–43 High Speed Chip Placer; 1998; pp. 1–3.

* cited by examiner

Primary Examiner—Matthew Smith
Assistant Examiner—Igwe U. Anya
(74) Attorney, Agent, or Firm—Arthur L. Plevy, Esq.; Duane, Morris & Heckscher, LLP

(57) ABSTRACT

A method for electronically connecting a semiconductor device comprising a substrate having a backside surface and a top surface on which is formed active elements, to an electronic circuit board having at least two electrical contacts connected to sources of different potentials for communicating at least two different signals; the method comprising forming at least two through-wafer via holes on the backside surface of the semiconductor substrate beneath each of the active regions extending therethrough to the top surface; forming a conductive layer of material within each of the via holes extending therethrough, each of the conductive layers formed within the corresponding via holes being electrically separated from one another; the at least two electrical contacts on the circuit board congruently aligned with corresponding conductive layers and associated via holes; and attaching the circuit board to the semiconductor substrate at each of the corresponding electrical contacts and conductive layers so as to provide electrical communication of the first signal with one of the active elements on the substrate through at least one of the via holes and to provide electrical communication of the second signal with one of the active elements on the substrate through at least another one of the via holes.

21 Claims, 6 Drawing Sheets

ETCH BACKSIDE VIA HOLES THRU-WAFER

SPUTTER AuGe/Au/Ti SEED LAYER

COAT/EXPOSE NEGATIVE TONE PHOTORESIST

DEVELOP PHOTORESIST THEN ETCH Ti

PLATE Au/Ni/Au/AuSn

STRIP PHOTORESIST THEN ETCH Ti, Au, AuGe

DICE WAFER, PLACE ON CIRCUIT BOARD

ETCH BACKSIDE VIA HOLES THRU-WAFER
AND APPLY SEED LAYER (SPUTTER)

COAT/EXPOSE PHOTORESIST

EXPOSED REGIONS
OF PHOTORESIST

DEVELOP PHOTORESIST AND
ETCH Ti LAYER

DEVELOP
(NEG TONE)
ETCH Ti

ETCH PHOTO-RESIST AND DICE WAFER

ATTACH TO CIRCUIT BOARD USING CONDUCTIVE EPOXY

LOW RF LOSS DIRECT DIE ATTACH PROCESS AND APPARATUS

FIELD OF THE INVENTION

The invention relates generally to the fabrication of integrated circuits, and more particularly to a method and apparatus which uses through-wafer via holes for both signal connections and ground connections within a semiconductor device, and wherein the device is attached to a circuit board using selectively placed conductive epoxy or solder attachment.

BACKGROUND OF THE INVENTION

It is well known in the art of integrated circuit (IC) processing and fabrication that bond pads for signal connections are placed around the perimeter of ICs, while through-wafer via holes are utilized for ground connections. It has been determined that for high frequency (e.g. X-band) applications, one obtains higher performance if the grounds are placed at locations closer to where they are utilized, rather than on the sides of the chips. In the prior art as shown in FIG. 3, these via holes 50 are used as ground connections between the active elements placed on the top surface 60a of a substrate (chip) 60 of an IC chip, and the bottom surface or backside 60b of the substrate 60. A metallized layer 70 (typically of solder) is formed on the backside 60b to provide the ground connection. In the prior art, the entire backside 60b of the substrate 60 is metallized to provide the ground connection of circuit board 90 with the top surface 60a of the substrate 60 by means of the via holes 50. Wire bonds 55 are then connected to the active elements of the chip 60 by coupling to bond pads 57 located around the perimeter of the chip 60 to provide positive and/or negative signal connections with electrodes 59a, 59b of the circuit board 90. Such signal connections are used in the fabrication of power amplifiers and other electronic devices utilizing positive and negative voltages, RF input and output signals, and the like. A heat sink or shim 66 is generally provided between the circuit board 90 and the IC chip 60 to perform the task of spreading and dissipating the heat buildup.

A number of problems, however, exist with the attach process and semiconductor apparatus described above in conjunction with FIG. 3. First, the use of the wire bonds for connecting with the bond pads around the perimeter of an IC chip poses a number of problems in the fabrication and operation of these electronic devices. For example, the length of the wire bond provides a source of variation which effects matching. Furthermore, the loop in the wire emits stray RF signals which result in signal loss and increased crosstalk. Accordingly, it is highly desirable to obtain a process and apparatus which eliminates these wire bonds and which allows signal connections in addition to ground connections to be provided at a position much closer to the active elements on the top surface of the substrate.

The present invention achieves this advantage through the use of through-wafer via holes for both signal and ground connections and provides a low RF loss semiconductor wafer die wherein patterned metalized layers are formed within a plurality of via holes on a semiconductor substrate and where an electronic member, such as a circuit board, is attached to the die using selectively placed conductive epoxy or solder attach. This permits RF signals to be fed in and out through the backside vias, in addition to ground connections, thereby eliminating the need for wire bonds.

SUMMARY OF THE INVENTION

A method for electronically connecting a semiconductor device comprising a substrate having a backside surface and a top surface on which is formed active elements, to an electronic circuit board having at least two electrical contacts connected to sources of different potentials for communicating at least two different signals; the method comprising forming at least two through-wafer via holes on the backside surface of the semiconductor substrate beneath each of the active regions extending therethrough to the top surface; forming a conductive layer of material within each of the via holes extending therethrough, each of the conductive layers formed within the corresponding via holes being electrically separated from one another; the at least two electrical contacts on the circuit board congruently aligned with corresponding conductive layers and associated via holes; and attaching the circuit board to the semiconductor substrate at each of the corresponding electrical contacts and conductive layers so as to provide electrical communication of the first signal with one of the active elements on the substrate through at least one of the via holes and to provide electrical communication of the second signal with one of the active elements on the substrate through at least another one of the via holes.

There is also provided a composite semiconductor device comprising an integrated circuit in electrical communication with a circuit board, the integrated circuit comprising: a semiconductor wafer substrate having a top surface on which active elements are formed, and a backside surface, a plurality of through wafer via holes formed on the backside surface, a plurality of conductive layers, each conductive layer disposed in a corresponding one of the via holes and electrically separated from one another; the circuit board having a plurality of electrodes for communicating various signals, wherein at least two of the electrodes are connected to sources of different potential on the circuit board, whereby the at least two electrodes communicate signals of different potential, the at least two electrodes congruently aligned with and in electrical communication with corresponding conductive layers each associated with one of the via holes in the semiconductor wafer so as to communicate the at least two signals of different potential between the semiconductor top surface and the circuit board electrodes through separate via holes.

DETAILED DESCRIPTION OF THE INVENTION

Referring now to FIGS. 1A–H there is shown the steps involved in attaching an integrated circuit to an electronic circuit board wherein through wafer via holes are formed within the substrate of the integrated circuit and where the electronic circuit board includes electrical connections which are patterned so as to align with each of the through wafer via holes in the substrate, so as to feed various signal connections in addition to ground connections, into and out of the integrated circuit through the backside via holes. The use of the through wafer via holes for various signal connections, in addition to ground connections, eliminates the need for wire bonds for providing "non-ground" signals.

Figure 1A:
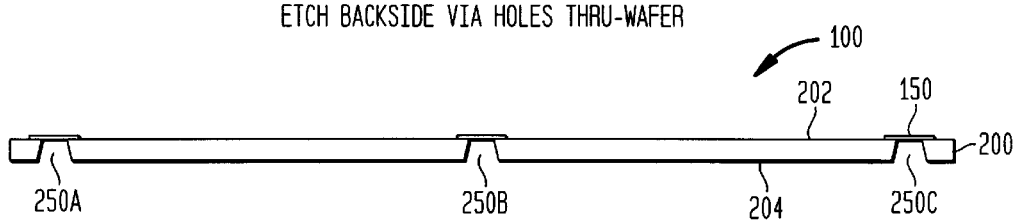
FIGS. 1A–1H illustrate the steps involved in the formation of the low RF loss direct die semiconductor using through-wafer via holes for three different signal connections according to the present invention.
Figure 1B:
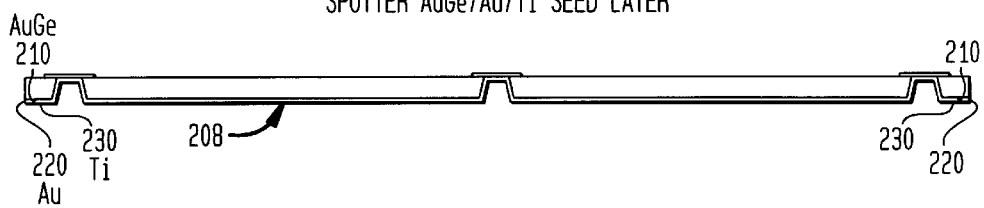

As shown in FIGS. 1A–H, an integrated circuit chip 100 comprising a semiconductor GaAs wafer or substrate 200 having a top surface 202 and a backside surface 204 includes active elements (not shown) which are formed on the top surface 202 of the substrate 200 to form a semiconductor device such as field effect transistors (FET), resistors, capacitors, inductors, operational amplifier circuits, and the like, using conventional integrated circuit active element formation techniques. According to the present invention, through wafer via holes 250 are formed on the backside surface 204 and extend through to the top surface 202 at predetermined locations on the semiconductor wafer 200. Via pads 150 are disposed on the top surface of the semiconductor substrate 200 to provide electrical connection with the active elements formed thereon. Each of the through-wafer via holes 250a, 250b, 250c as shown in FIG. 1A are disposed beneath each of the corresponding via pads 150 underneath the active region of the integrated circuit device. A seed back metal layer 208 is then sputtered onto the backside surface of the semiconductor substrate 200, including the surfaces within each of the via holes 250a, 250b, 250c, for plating purposes (see FIG. 1B). Preferably, the seed layer 208 is sputtered onto the substrate 200 by depositing a first adhesive layer 210 of gold germanium (AuGe) onto the substrate 200, a second plating layer 220 of gold material (Au), and a third adhesive layer 230 of titanium (Ti) for promoting adhesion with a photo resist layer 240 (FIG. 1C) to be deposited on top of the sputtered seed layer 208. The plating layer 220 is preferably twice as thick as both of the adhesive layers 210, 230. In the preferred embodiment, AuGe layer 210 and Ti layer 230 have a thickness of approximately 500 Angstroms (A), while the Au layer 220 has a thickness of approximately 1000 A. It should be noted that the titanium adhesive layer 230 is optional, but has been found to be most effective in promoting adhesion of the photo resist material to the plating seed layer 208.

Figure 1C:
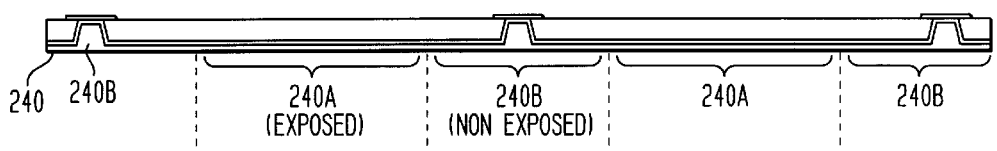
Figure 1D:
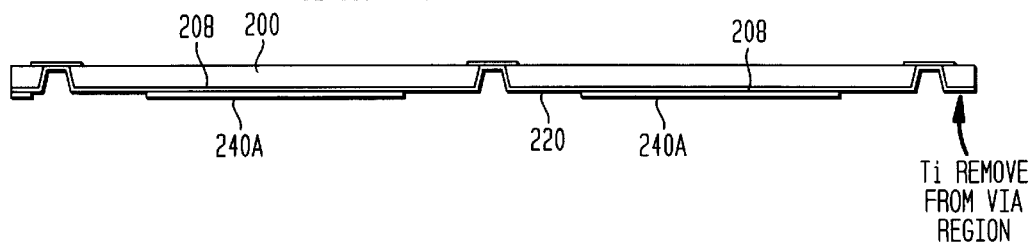

As shown in FIG. 1C, a negative tone photo resist layer 240 is then deposited over the seed layer 208, thereby coating the entire seed layer 208. Preferably, the negative tone photo resist layer 240 has a thickness ranging from 1 to 8 microns ($\mu$m) and is applied to form a substantially planar bottom. Note that a positive tone photo resist may also be utilized. However, since the via hole length has approximately an order of magnitude difference than the photo resist thickness formed at the bottom 204 of the substrate 200, the use of a positive tone photo resist may cause problems in eliminating the resist out of the holes 250a, 250b, 250c. This problem may be exacerbated since the via hole interiors are often rough, resulting in edges which may cause shadowing problems for eliminating the photo resist. Thus, an aqueous developable negative tone resist layer is preferred, so that no conversion of the photo resist within the via holes 250a, 250b, 250c is necessary. The negative tone photo resist is then exposed using conventional techniques at predetermined locations on the wafer which are outside each of the via holes 250 so that exposed regions 240a of photo resist layer 240 are formed outside each of the via holes 250a, 250b, 250c, while unexposed regions 240b of photo resist layer 240 separate each of the corresponding exposed regions 240a and fill each of the vias 250a, 250b, 250c. In this manner, the exposed photo resist regions 240a operate to expose inverse transmission lines on the semiconductor wafer 200, where no signal connections will be made between the integrated circuit and a circuit board 500 (see FIGS. 1G and 1H). The photo resist layer 240 is then developed to provide the out transmission lines and via holes 250a, 250b, 250c using conventional techniques for developing photo resist, and the adhesive seed layer 230 of Ti is then etched to remove the Ti layer from each of the via hole regions 250. The fabrication process at this stage is shown in FIG. 1D, wherein a separation layer of exposed photo resist material 240a operates to separate each of the corresponding via hole regions 250 from one another, and which comprise a seed layer of gold germanium 210 for adhesion to the backside 204 of the substrate 200 and the exposed layer 220 of plating gold for plating.

Figure 1E:
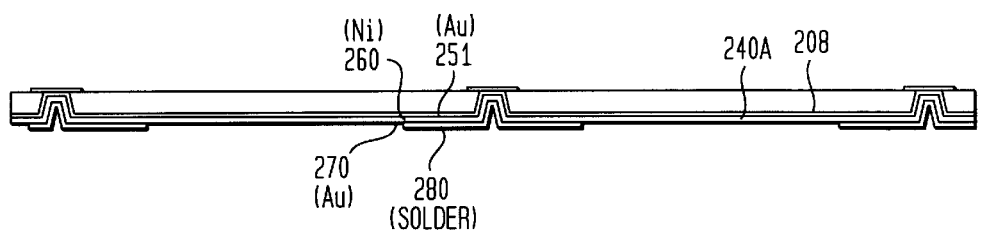
Figure 1F:
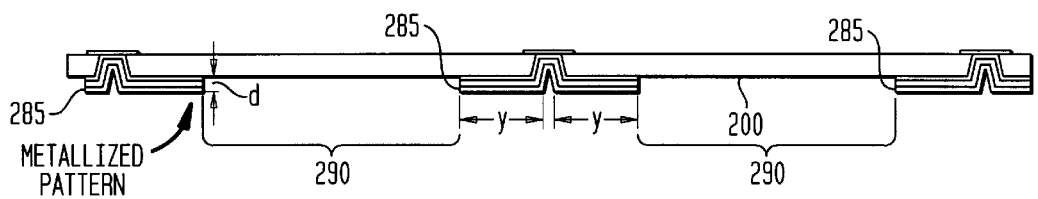
Figure 1G:
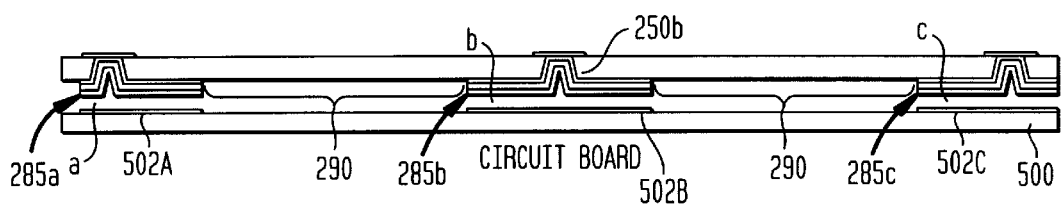
Figure 1H:
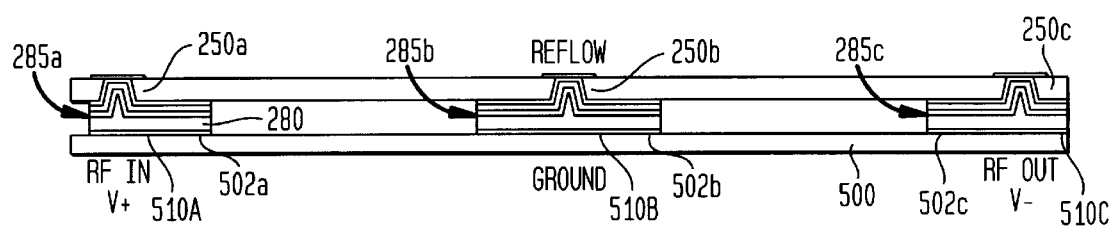

As shown in FIG. 1E, the via hole regions 250 are then plated by depositing a first metal layer 251 of gold material of between 1 and 3 $\mu$m in thickness onto the exposed gold seed layer 220 for current carrying capability and low via resistance. In the case where a solder attach process is used to connect the IC substrate 200 with the circuit board 500 (FIGS. 1G and 1H), an additional layer 260, which operates as a barrier layer, is next formed onto the gold metal layer 251 to operate as a barrier between the gold germanium substrate and the soldering surface. Preferably, the barrier layer 260 is comprised of a 1 $\mu$m thick nickel (Ni) layer. Next, a layer 270 of Au is then plated onto the nickel layer 260 and a layer of solder 280 is then plated onto layer 270. Preferably, the solder plating is approximately 10 $\mu$m thick and operates to provided eutectic attachment with corresponding electrical connections on the circuit board 500 (FIGS. 1G and 1H). In the preferred embodiment, solder plating layer 280 may be comprised of a layer of AuSn or PbSn material.

Note that the plated gold layer 270 is used so as not to oxidize the tin material in layer 280. In FIG. 1F, exposed photo resist regions 240a are then stripped using conventional techniques such as chemical or plasma etching so as to uncover the seed layer 208 previously formed above the exposed photo resist regions 240a. The now uncovered seed layer 208 disposed outside of the via hole regions 250, is then selectively etched so as to remove the Ti, Au, and AuGe seed layers 230, 220, 210 using conventional etching techniques.

As shown in FIG. 1F, each of the through wafer via hole regions 250 are covered with each of the seed layers 210, 220, plating layers 251, 260, 270, and solder layers 280 within the via holes 250a, 250b, 250c, forming a conductive laminate layer 285 which operates to cover the entire via so as to provide a sufficient transmission line for current carrying and signal transmission properties. Note that the composite laminate layer 285, in the preferred embodiment, extends a predetermined distance D, in the vertical direction beyond the bottom or backside surface 204 of the substrate 200 while extending a predetermined distance Y (approximately 10 $\mu$m) in either direction from the edge of each via aperture (typically 120–140 $\mu$m), so as to provide a sufficiently sized area for conductive contact with the congruently aligned circuit board connections.

As previously mentioned, each of the conductive layers 285 formed within the associated via holes (250a, 250b, 250c) are electronically separated from one another via separation region 290, as illustrated in FIGS. 1F–H. The wafer 200 is then diced along portions of the separation regions using conventional dicing techniques, whereby each of the dies contains or includes at least two through-wafer vias operating as transmission lines for transmitting separate signals between the integrated circuit and circuit board.

FIG. 1G illustrates three separate via holes 250a, 250b, 250c for connection with corresponding electrodes on circuit board 500. As one can ascertain, the diced wafer 200 comprises a metalized pattern of conductive layer 285a, 285b, 285c and via hole 250a, 250b, 250c transmission points separated by separation regions 290. The circuit board 500 contains a mirror image of this pattern on top surface 502 whereby corresponding electrical connections or contact points (i.e. electrodes) 502a, 502b, 502c are disposed in a pattern so as to congruently align with the corresponding conductive layers (285a, 285b, 285c) and associated via holes (250a, 250b, 250c) within the semiconductor wafer. Each of the contact points or electrodes 502a, 502b, 502c are electrically separated from one another and operate to communicate or electrically conduct signals of different potential to the top surface of the substrate via a corresponding through wafer via hole 250a, 250b, 250c. Note that, as shown in FIGS. 1G and 1H, each contact 502a, 502b, 502c is uniquely associated with a conductive layer/via hole combination 285a/250a, 285b/250b, 285c/250c so as to communicate a separate signal between the IC chip and the circuit board.

As shown in FIGS. 1G and H, the diced wafer 200 is then placed onto the circuit board 500 and may be attached using either conductive epoxy or solder attach. In the embodiment as shown, the solder layer 280 is heated so as to cause reflow of the solder to conductively engage and bind with the electronic connections on the circuit board 500 at each of the regions a, b, and c. In this manner, electrical communication of a first signal is provided between the circuit board 500 and the top surface 202 of the substrate 200 through via hole 250a which is connected via the conductive material 285a to contact 502a for transmitting a signal 510A of a first potential, while via holes 250b operates to connect contact 502b with the top surface 202 of the substrate 200 through the corresponding conductive layer 285b to provide electrical communication of a second signal 510B. Electrical contact 502c is coupled via the conductive layer 285c through corresponding via hole 250c to the top surface 202 of the substrate 200 for transmitting a third signal 510C there between. As shown in FIG. 1H, signal 510a may be an RF input signal for transmission to the IC chip, while signal 510b and 510c represent a ground signal and RF output signal (from the chip) respectively. Alternatively, signal 510a may represent a positive voltage signal for transmission to the active elements of the integrated circuit, while signal 510c may represent a negative voltage to be applied to the top surface of the substrate 200 for connection with the active elements formed thereon. Circuit board connections to sources of positive, negative, and ground potential for communicating each of the various signals are illustrated schematically in FIGS. 1G and 1H.

As one can ascertain, the transmission of RF signals into or out of the semiconductor device through the backside vias eliminates the wire bonds used in the prior art. Note that when using the solder attach process, it is important to maintain or increase the chamber pressure until the substrate is cooled, so as to avoid any trapped gases within the molten solder from expanding, causing improper connection between the chip and the circuit board. Note also that conventional design rules apply to the wafer backside metal lines. That is, the solder attach process utilizes approximately 200 μm minimum width, and 100 μm minimum spacing for solder attach.

As one can ascertain, plating solder directly onto the chip 100 provides a more reliable die attach, while reducing the cost of materials and significantly simplifying the attach process. Note however, that the circuit board 500 now performs the task of thermal heat spreading (e.g. for use with high power amplifiers), since the heat spreader or shim has been eliminated..

In an alternative embodiment, illustrated in FIG. 2, the low RF loss direct die attach process for connecting the integrated circuit with the circuit board using two via holes (one for a signal connection and one for a ground connection) is illustrated using a conductive epoxy attachment. For the process wherein a conductive epoxy is used, many of the same steps apply as discussed in the process described previously. Accordingly, like reference numerals are used to indicate like parts.

Figure 2A:
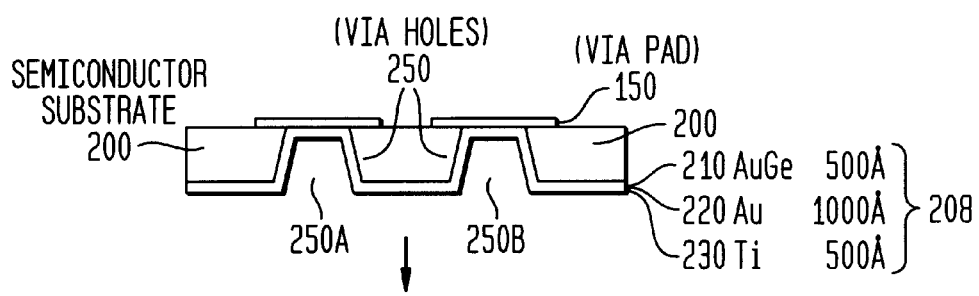
FIGS. 2A–2E illustrate the loss RF loss direct die attach process utilizing two via holes, a positive signal and ground connection respectively, according to the present invention.
Figure 2B:
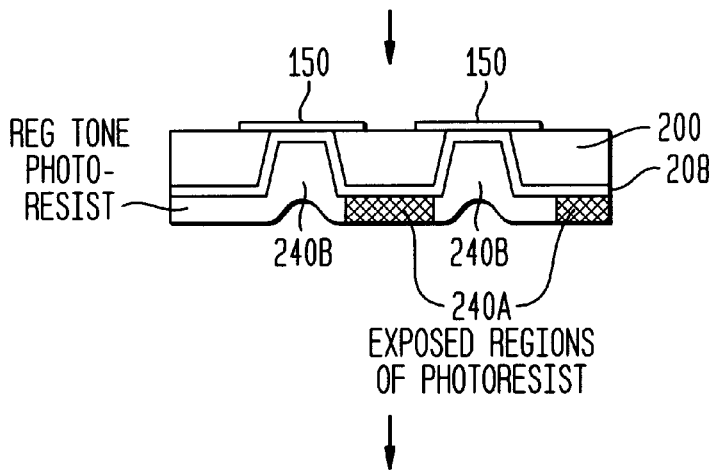
Figure 2C:
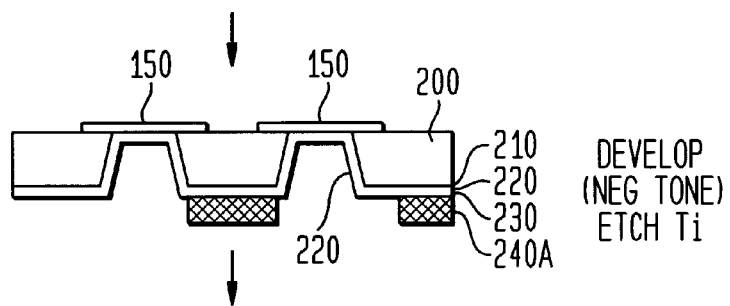

As shown in FIG. 2A, seed layer 208 of gold germanium 210, gold 220 and tin 230 laminate is deposited sequentially for plating purposes and negative tone photo resist layer 240 is applied to the bottom surface of the substrate 200 which operates to somewhat planarize the surface while exposing regions of photo resist 240B outside of the via holes (see FIG. 2B). The photo resist layer 240 is then developed and the Ti seed layer 230 within the via hole region 250 is etched to expose the gold layer plating 220 (see FIG. 2C).

Figure 2D:
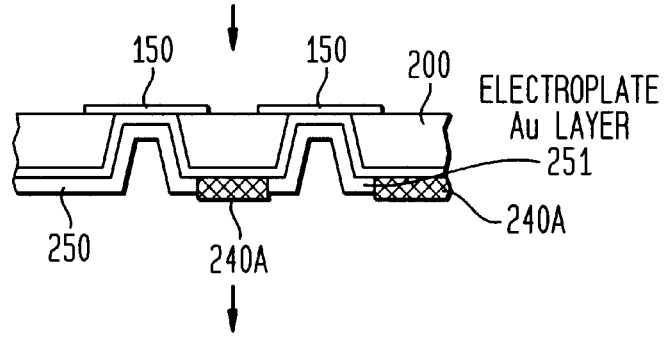
Figure 2E:
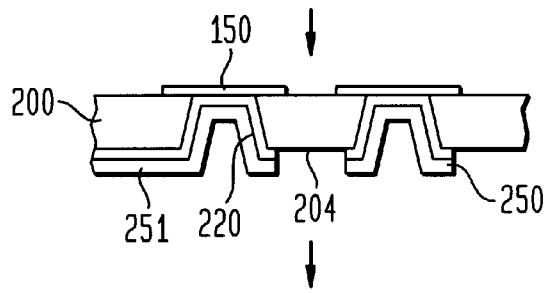
Figure 2F:
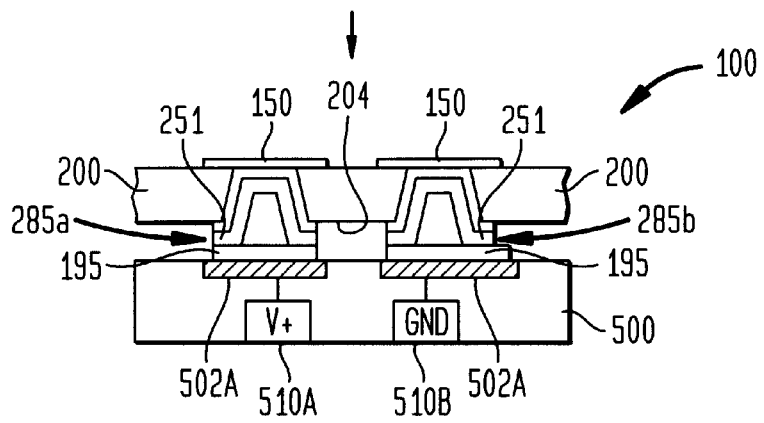
Figure 3:
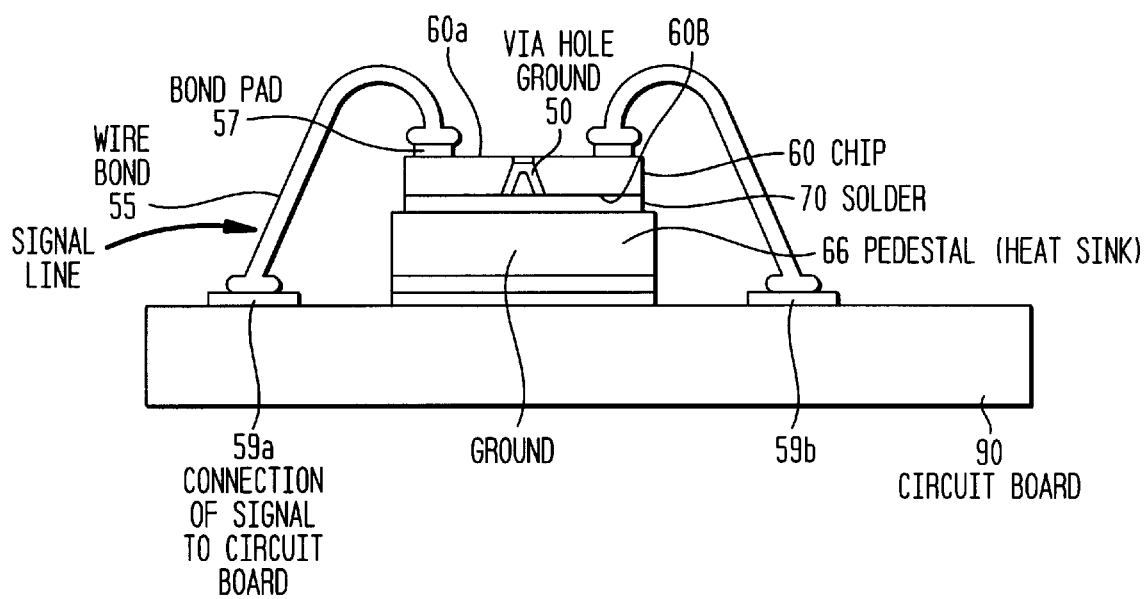
FIG. 3 is a schematic illustration of a prior art die attach method and apparatus for connecting an integrated circuit with a circuit board for providing various signal connections.

Plated layer 251 of Au material is then plated onto the seed layer 220 (see FIG. 2D). Note that neither the nickel barrier layer, nor the solder layer is used in the epoxy process. The exposed regions of photo resist 240A are then stripped using conventional etching techniques as shown in FIG. 2E. The gold and gold germanium seed metal layers 220, 210 are then sequentially etched in the separation regions outside the via holes as shown in FIG. 2E. The wafer 200 is then diced and placed onto the circuit board 500, using selectively placed conductive epoxy 195 as illustrated in FIG. 2F. Preferably, the epoxy is placed onto the electrical contacts on the circuit board and attached to the corresponding conductive layers 285a, 285b and via holes on the chip 100. The electronic circuit has electrical contacts 502A, 502B connected to sources of different potential (V+, GND) in well-known fashion which will not be described in detail herein. The electrical connections are located at regions corresponding to each of the via holes for communicating signal 510A through the corresponding via hole, and a different signal 510B through the other via hole. Note that in contrast to the solder attach process, the resolution for the epoxy is somewhat lower (i.e. 500/300 μm line/space).

Note that the epoxy attach assemblies allow greater flexibility because the conductive lines on the die and circuit board are only required to align at the connection points where the epoxy is present, since an airgap is formed in the other areas.

It will be understood that the embodiments described herein are exemplar, and that a person skilled in the art may make many variations and modifications without departing from the spirit and scope of the invention. For instance, while a GaAs substrate has been shown, other semiconductor substrates may also be utilized. Furthermore, while an adhesive seed layer of gold germanium has been illustrated for adhesion to the GaAs substrate backside, other materials may also be used such as chrome, Ti, and TiW for the adhesive attachment. Furthermore, one may also include a refractory metal nitride to the via pad for providing a solder diffusion barrier such as a layer of TiWn of approximately 1000 angstroms. All such modifications and variations are intended to be within the scope of the invention, as defined by the appended claims.

What is claimed is:

1. A method for electronically connecting a semiconductor device comprising a substrate having a backside surface and a top surface on which is formed active elements, to an electronic circuit board having a least two electrical contacts connected to sources of different potentials for communicating at least two different signals; said method comprising:

forming at least two through-wafer via holes on said backside surface of said semiconductor substrate beneath each of said active regions extending therethrough to said top surface;

forming a conductive layer of material within each of said via holes extending therethrough, each of said conductive layers formed being electrically separated from one another; said at least two electrical contacts on said circuit board congruently aligned with corresponding said conductive layers and associated via holes; and attaching said circuit board to said semiconductor substrate at each of said corresponding electrical contacts and conductive layers so as to provide electrical communication of at least one first signal with one of said active elements on said substrate through at least one of said via holes and to provide electrical communication of at least one second signal with one of said active elements on said substrate through at least another one of said via holes.

2. The method according to claim 1, wherein said at least one first signal is a ground signal and wherein said at least one second signal has a positive or negative potential.

3. The method according to claim 1, wherein the step of forming said conductive layer of material within each of said via holes comprises:

depositing a back metal seed layer onto the backside of said substrate;

coating said back metal seed layer using a photo resist and exposing regions of said photo-resist outside of said via holes;

developing said photo-resist and removing at least a portion of said seed layer disposed over unexposed photo-resist regions, thereby providing an uncovered seed layer portion; and removing said exposed photo-resist layer and said seed layer covered by said exposed photo-resist layer to uncover a portion of said substrate bottom surface to provide said conductive layer in a pattern on said bottom surface of said wafer.

4. A method of forming a low loss semiconductor for attaching to an electronic circuit comprising:

disposing a plurality of via pads on a top surface of a semiconductor wafer substrate for electrically connecting with active elements formed thereon;

forming a plurality of through-wafer via holes in said semiconductor substrate beneath said via pads;

depositing a back metal seed layer onto a bottom surface of said substrate;

coating said back metal seed layer using a photo resist and exposing regions of said photo-resist outside of said via holes;

developing said photo-resist and removing at least a portion of said seed layer disposed over unexposed photo-resist regions, thereby providing an uncovered seed layer portion;

forming a plated metal layer over the uncovered seed layer portion; and removing said exposed photo-resist layer and said seed layer covered by said exposed photo-resist layer to uncover a portion of said substrate bottom surface to provide patterned metallized layers on said bottom surface of said wafer which are electrically separated from one another for electrically attaching to said electronic circuit having electrical contacts connected to sources of different potential at regions corresponding to each of said via holes for communicating a signal through at least one of said via holes, and a different signal through at least another one of said via holes.

5. The method according to claim 4, further comprising the step of attaching said patterned metallized layers to said electronic circuit at regions corresponding to each of said via holes using a solder attach.

6. The method according to claim 4, further comprising the step of attaching said patterned metallized layers to said electronic circuit at regions corresponding to each of said via holes using conductive epoxy.

7. The method according to claim 4, further comprising the steps of:

dicing said wafer to form a plurality of semiconductor dies, each die including a plurality of metallized layer segments, each metallized layer segment disposed within a corresponding through wafer via hole in said wafer substrate; and conductively attaching said patterned metallized layer segments from at least one said die to said circuit at selected locations to provide different signal connections between said circuit and the top surface of said semiconductor substrate through at least two of said via holes.

8. The method according to claim 4, wherein the step of depositing a back metal seed layer onto the bottom surface of the substrate further comprises:

sputtering an adhesive layer onto said substrate, a plating layer onto said adhesive layer and an adhesive photoresist layer onto said plating layer.

9. The method according to claim 8, wherein said adhesive layer comprises a layer of AuGe, said plating layer comprises a layer of Au, and said adhesive photoresist layer comprises a layer of Ti.

10. The method according to claim 9, wherein said AuGe adhesive layer has a thickness of substantially 500 angstroms, said Au plating layer has a thickness of substantially 1000 angstroms, and said Ti adhesive photoresist layer has a thickness of substantially 500 angstroms.

11. The method according to claim 8, wherein said photo resist comprises a negative tone photo resist.

12. The method according to claim 11, wherein the step of removing at least a portion of said seed layer disposed over unexposed photoresist regions further comprises etching said adhesive photoresist layer to uncover said plating layer.

13. The method according to claim 12, wherein the step of forming a plated metal layer over the uncovered seed layer portion further comprises plating a first metal layer for current carrying and via resistance onto said Au plating seed layer.

14. The method according to claim 13, wherein the step of forming said plated metal layer further comprises plating a barrier layer of metal over said first metal layer.

15. The method according to claim 14, wherein the step of forming said plated metal layer further comprises plating solder layer over said barrier layer.

16. The method according to claim 15, wherein said first metal layer comprises a layer of Au, said barrier layer comprises a layer of Ni, and said solder layer comprises a layer of AuSn or PbSn.

17. The method according to claim 15, wherein the step of etching at least a portion of said plated metal layer to provide patterned metallized layers on a portion of the bottom surface of said wafer further comprises etching said solder layer and said barrier layer.

18. The method according to claim 17, further comprising the steps of:

dicing said wafer and aligning said electronic circuit having electrical contacts so that said contacts are congruently aligned with corresponding ones of said patterned metallized layers associated with corresponding via holes, engaging said congruently aligned electrical contacts on said electronic circuit with said corresponding patterned metallized layers, and heating said patterned metallized layers to reflow said solder layer to physically attach and electrically couple said circuit board contacts with said diced wafer through said via holes.

19. The method according to claim 13, wherein said first metal layer has a thickness of approximately 1–3 microns (um), said barrier layer has a thickness of approximately 1 um, and said solder layer has a thickness of approximately 10 um.

20. The method according to claim 4, wherein said at least one of said via holes conducts a ground signal, and wherein at least another of said via holes conducts a positive or negative potential signal.

21. The method according to claim 4, wherein said at least one of said via holes conducts a ground signal, at least another of said via holes conducts an input RF signal, and at least a third one of said via holes conducts an output RF signal.

* * * * *